United States Patent [19]

Kilian et al.

[11] Patent Number: 5,786,694
[45] Date of Patent: Jul. 28, 1998

[54] GRADIENT COIL SYSTEM FOR USE IN A DIAGNOSTIC MAGNETIC RESONANCE APPARATUS

[75] Inventors: Volker Kilian, Frammersbach; Michael Sellers, Erlangen, both of Germany

[73] Assignee: Siemens Aktiengesellschaft, Munich, Germany

[21] Appl. No.: 813,086

[22] Filed: Mar. 7, 1997

[30] Foreign Application Priority Data

Mar. 29, 1996 [DE] Germany ............ 196 12 478.6

[51] Int. Cl.$^6$ ............................................. G01V 3/00
[52] U.S. Cl. ............................................. 324/318; 324/322
[58] Field of Search ............................. 324/318, 322, 324/314, 309; 128/653.5

[56] References Cited

U.S. PATENT DOCUMENTS

| 5,666,054 | 9/1997 | Westphal | 324/318 |
| 5,675,255 | 10/1997 | Sellers | 324/318 |

Primary Examiner—Louis M. Arana
Attorney, Agent, or Firm—Hill & Simpson

[57] ABSTRACT

A gradient coil system for a diagnostic magnetic resonance apparatus has two gradient coil arrangements rotated perpendicular to one another, for the production of transverse magnetic field gradients. The two gradient coil arrangements each have several coil pairs arranged along an axis. The coil pairs are each formed by two gradient coils of the segment type. The respective numbers of coil pairs in the two gradient coil arrangements are different from one another, and the gradient coils of the two gradient coil arrangements mutually overlap one another.

14 Claims, 2 Drawing Sheets

GRADIENT COIL SYSTEM FOR USE IN A DIAGNOSTIC MAGNETIC RESONANCE APPARATUS

BACKGROUND OF THE INVENTION

1. Field of the Invention

The present invention is directed to a gradient coil system for use in a diagnostic magnetic resonance apparatus.

2. Description of the Prior Art

A gradient coil system for a diagnostic magnetic resonance apparatus is known from U.S. Pat. No. 5,198,769 which has a first gradient coil arrangement and a second gradient coil arrangement, arranged around an axis and respectively offset by an angle of 90° around the axis, in order to produce two magnetic gradient fields oriented parallel to the axis, with magnetic field gradients oriented perpendicularly to one another and perpendicularly to the axis (transverse gradients). Each of the first and second gradient coil arrangements has several coil pairs arranged along the axis, and the coil pairs are formed respectively from two gradient coils that are arranged so as to lie laterally opposite the axis, and whose coil surfaces are oriented substantially perpendicular to the axis, and whereby the gradient coils of the two gradient coil arrangements overlapping one another.

In this known system, the gradient coil arrangements are disposed in a hollow cylindrical inner chamber of a basic field magnet such that a segment of each winding of the gradient coils lies on as small a radius as possible and another segment lies on as large a radius as possible in relation to the cylinder axis (segment type). At least some winding segments subtend an angle of 120°. By means of this arrangement, the magnetic scatter field produced by the gradient coil in the external chamber is significantly reduced. Since the Lorentz forces act radially and in anti-parallel fashion on the segments, on the whole only small overall forces arise, so that mechanical vibration can be easily damped structurally. The noise caused by the switching on and off of the gradients thereby can be significantly reduced.

PCT Application WO 94/28 430 likewise describes a gradient coil system of the type discussed above. It is also indicated therein that the coils, which are shaped as segments of circular rings, subtend an angle of 120° about the axis.

In the dimensioning of the gradient coil arrangements, it is a goal to maximize the useful volume, in which the magnetic field gradient is strictly linear. The radii of the arc-shaped conductor segments, the angle subtended by the arcs about the axis or the number of coil pairs used influence the shape and size of the useful volume, the coil pairs themselves being arranged symmetrically in relation to a plane of symmetry in the center of the useful volume. The greatest influence on the useful volume, however, is exerted by the mutual axial spacings of the coil pairs, which thus are also preferably optimized when the other parameters are held constant.

For the two transverse gradient fields, gradient coil arrangements can be used that are basically the same, arranged only so as to be rotated 90° to one another around the aforementioned axis. In gradient coils of the segment type discussed above, this results in a partial overlapping of the gradient coils of both gradient coil arrangements, if the angles subtended by the winding segments are greater than 90°. Angles of the order of magnitude of 120° are generally desirable, in order to be able to produce a linear gradient in as large a useful volume as possible. Under such circumstances, however, the coil pairs for the two transverse gradient fields then cannot be arranged exactly in their optimal positions, but rather must be slightly displaced in relation to the position at which optimization would occur. The size of the useful volume is sensitive to displacements of this type, and can be reduced up to 50% in the axial direction as a result. An axial displacement of the two gradient coil arrangements as a whole in relation to one another has the disadvantage that the surfaces in which the gradient fields are respectively zero are mutually displaced.

The drastic reduction of the useful volume due to non-optimal positioning of the coil pairs is the most significant concern in gradient coil systems with a larger number of coil pairs. A larger number of coil pairs is required for the production of gradient fields with a large gradient and for the enlargement of the useful volume in the axial direction. These characteristics are particularly desirable in local gradient coil systems such as, for example, special gradient coil systems for head examinations.

SUMMARY OF THE INVENTION

An object of the present invention is to provide a gradient coil system for the production of magnetic fields with transverse gradients, in which the useful volume, in which the magnetic field gradient is strictly linear, is optimized for both gradient coil arrangements.

The above object is achieved in accordance with the invention in a gradient coil system of the type described above but with the number of coil pairs in the two gradient coil arrangements being different from one another.

It is thereby possible at first to position additional coil pairs in one gradient coil arrangement at free spaces within the other gradient coil arrangement, and subsequently to determine the axial positions of the remaining coil pairs by means of an optimization method. The positions of the coil pairs in the other gradient coil arrangement remain unaltered.

In one embodiment, a coil pair of the first gradient coil arrangement is arranged in a plane of symmetry of the gradient system. The field modification caused by the additional coil pair can be compensated by a corresponding positioning of the remaining coil pairs of the gradient coil arrangement.

DESCRIPTION OF THE PREFERRED EMBODIMENTS

Figure 1:
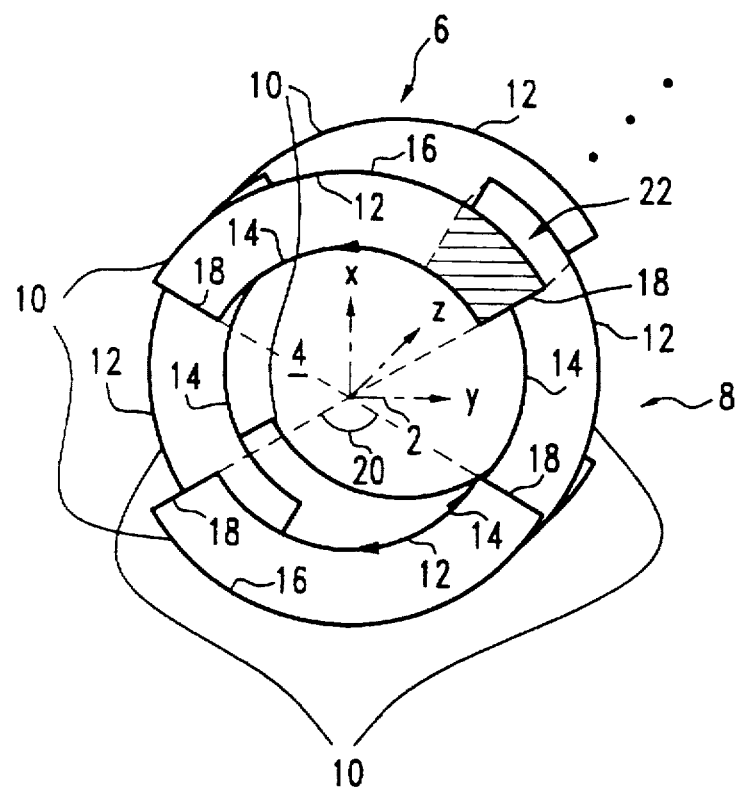
FIG. 1 is a perspective view of a basic arrangement of mutually overlapping coil pairs for the generation of two transverse magnetic field gradients, in a gradient coil system constructed in accordance with the principles of the present invention.

In the following specification, reference is made to a rectangular xyz coordinate system 2. FIG. 1 shows a segment of a gradient coil system for a diagnostic magnetic resonance apparatus for the production of magnetic gradient fields in a useful volume 4 inside the gradient coil system. The gradient fields are oriented parallel to the z coordinate axis, and have two transverse gradients perpendicular to one another.

A first gradient coil arrangement 6 produces a magnetic gradient field with a magnetic field gradient in the x direction. A second gradient coil arrangement 8 produces a gradient field with a magnetic field gradient in the y direction. The gradient coil arrangements 6 and 8 respectively have several coil pairs 10 that are each arranged along the z coordinate axis.

FIG. 1 shows, as an example for the first gradient coil arrangement 6, two coil pairs 10, and for the second gradient coil arrangement 8 shows one coil pair 10. In fact, the first and second gradient coil arrangements 6 and 8 have additional axially spaced coil pairs 10 which, however, are not shown for clarity.

The coil pairs 10 are respectively formed by two gradient coils 12, which are arranged laterally opposite the z coordinate axis, and the coil surfaces thereof, i.e. the surfaces enclosed by the windings, are oriented perpendicularly in relation to the z coordinate axis. The gradient coils 12 are accordingly arranged on planes that lie parallel to the xy plane of the coordinate system 2 with different z coordinates.

The gradient coils 12 are of the same construction with regard to geometry and number of windings. They have first, inner winding segments 14, in the shape of a circular arc, which are adjacent to the useful volume 4. A second, outer winding segment 16 in the shape of a circular arc serves as a return. The midpoints of the two winding segments 14 and 16 lie on the z coordinate axis. The ratio of the radii of the winding segments 14 and 16 lies in a range from 1.4 to 1.6. This is a compromise between the desired outward shielding effect and the field strength of the gradient fields in the useful volume 4. Each winding is closed by two radially oriented third winding segments 18. The first and second winding segments 14 and 16 respectively cover an angle 20 of around 120° about the z coordinate axis.

Since the coverage angle of the windings in the direction of the circumference is greater than 90°, the gradient coils 12 of the two gradient coil arrangements 6 and 8 mutually overlap. In the gradient coils 12 used herein, with a coverage angle of 120°, an overlap region 22 of 30° results, emphasized in FIG. 1 by slanted cross-hatching. Further details of the gradient coils used herein are described in U.S. Pat. No. 5,198,769, mentioned above.

In conventional gradient systems, the gradient coil arrangements 6 and 8 for the production of the transversal gradients in the x and y direction are of the same construction.

Figure 2:
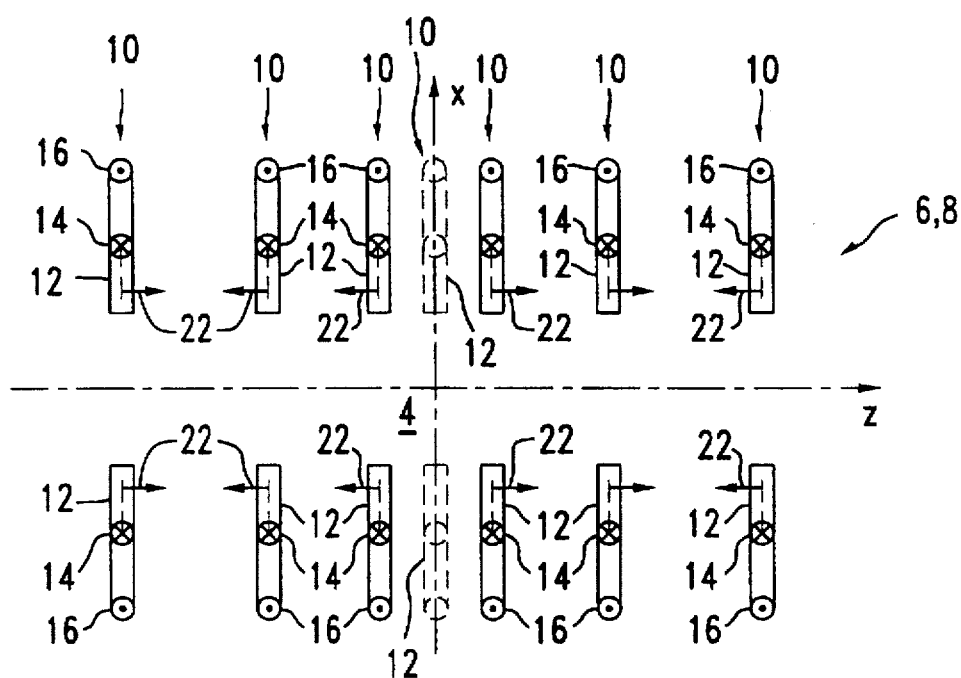
FIG. 2 is a side view in section of the arrangement, showing the operation of an additional coil pair in the xy plane, with z=0 at the position of the remaining coil pairs in the gradient coil arrangement.

An optimization of the individual gradient coil pairs 10, with parameters otherwise the same, such as for example the geometry of the windings, the number of the windings and the excitation current (ampere-turns or electric loading) with respect to their axial position would then result in a symmetrical arrangement with respect to the xy plane, given z=0. The optimal axial positions of the coil pairs that result from an optimization of this type are drawn in FIG. 2, and generally hold both for the first gradient coil arrangement 6 and also for the second gradient coil arrangement 8. Due to the mutual overlapping, the positions obtained from this optimization, however, cannot be used for both gradient coil arrangements 6 and 8, but rather only for a gradient coil arrangement 8.

The first gradient coil arrangement 6 is supplemented in the xy plane lying in the coordinate origin by an additional coil pair 10. A re-optimization of the axial positions of the coil pairs 10 for the first gradient coil arrangement 6 results in a displacement of the remaining coil pairs 10 in the direction of the arrows 22. Space is thereby created for an overlapping arrangement, given optimal positions of the coil pairs 10, for both gradient coil arrangements 6 and 8.

Figure 3:
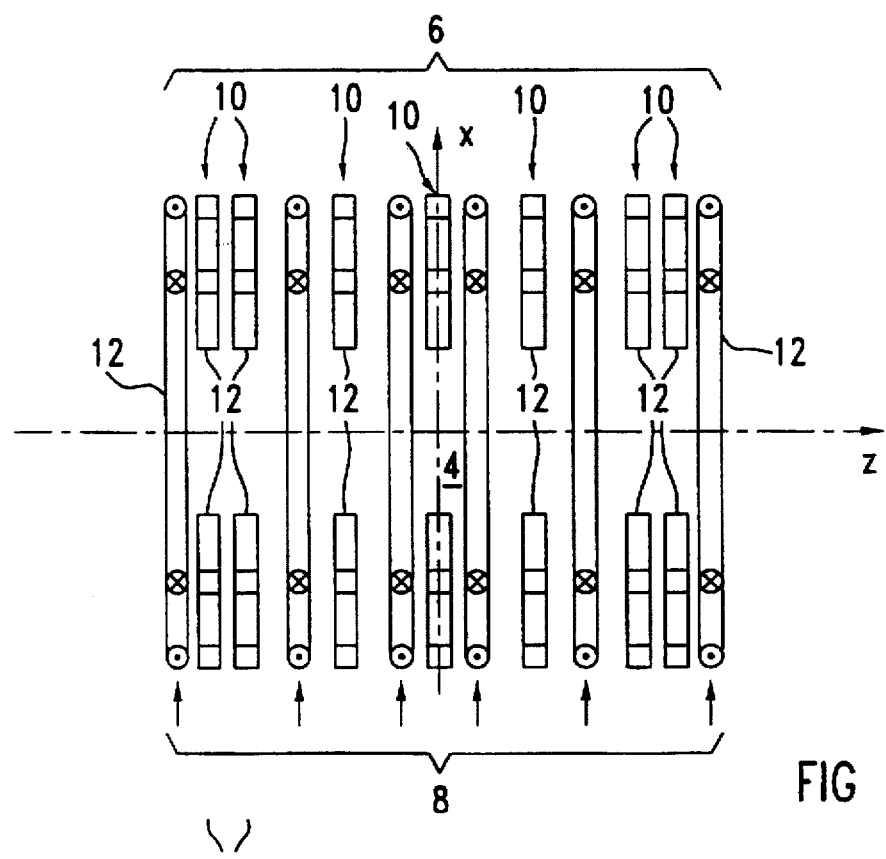
FIG. 3 shows in section, a side view of a gradient coil system of the invention, with optimized positions of the two gradient coil arrangements, rotated 90° relative to one another.

The gradient coil system that then results is shown in FIG. 3 in a side view. The first gradient coil arrangement 6 for the x-gradient has seven coil pairs 10, while the second gradient coil arrangement 8 for the y-gradient comprises only six coil pairs 10. The positions of all coil pairs 10 are optimized in order to obtain a maximum useful volume 4 with a linear magnetic field gradient in the x and y directions.

Although modifications may be proposed by those skilled in the art, it is the intention of the inventors to include within the claims of the patent warranted hereon all such changes and modifications as reasonably come within our contribution to the art.

We claim as our invention:

1. In a gradient coil system for a diagnostic magnetic resonance apparatus having a first gradient coil arrangement and a second gradient coil arrangement both disposed relative to an access and rotationally offset relative to each other at an angle of 90° for producing two magnetic gradient fields parallel to said axis with magnetic field gradients oriented perpendicularly to each other and perpendicular to said access, each of said first and second gradient coil arrangements including a plurality of coil pairs disposed along said axis, and each coil pair being formed by two gradient coils disposed laterally opposite each other relative to said axis with coil surfaces oriented substantially perpendicularly to said axis, the gradient coils in the respective first and second gradient coil arrangements overlapping each other, the improvement comprising:

said first gradient coil arrangement having a first number of said coil pairs an said second gradient coil arrangement having a second number of said coil pairs, said first and second numbers being unequal.

2. The improvement of claim 1 wherein said first number is odd and said second number is even.

3. The improvement of claim 2 wherein said first number is greater by one than said second number.

4. The improvement of claim 1 wherein said gradient coil system has a symmetry plane, and wherein one of said coil pairs of said first gradient coil arrangement is disposed in said symmetry plane.

5. The improvement of claim 1 wherein all of said gradient coils have a same electric loading.

6. The improvement of claim 1 wherein all of said gradient coils have a same number of ampere turns.

7. The improvement of claim 1 wherein all of said gradient coils have a same number of windings.

8. The improvement of claim 1 wherein each gradient coil has a first winding segment curved around said axis and a second winding segment curved around said axis, said first winding segment being disposed at a smaller distance from said axis than said second winding segment.

9. The improvement of claim 8 wherein said first and second winding segments in each gradient coil are parallel to each other.

10. The improvement of claim 8 wherein each of said first and second windings in each gradient coil comprises a circular arc.

11. The improvement of claim 8 wherein each of said gradient coils subtends an angle of approximately 120° around said axis.

12. The improvement of claim 8 wherein a ratio of the spacing of said second winding segment in each gradient coil to the spacing of said first winding segment relative to said axis is in a range from 1.4 to 1.6.

13. The improvement of claim 1 wherein each of said gradient coil pairs is identically spaced along said axis.

14. The improvement of claim 1 wherein said gradient coils in each coil pair are spaced a distance from each other in a range from 30 cm to 40 cm.

* * * * *